United States Patent
Shimizu (10) Patent No.: US 10,553,279 B2
(45) Date of Patent: Feb. 4, 2020

(54) SEMICONDUCTOR MEMORY DEVICE

(71) Applicant: TOSHIBA MEMORY CORPORATION, Tokyo (JP)

(72) Inventor: Naoki Shimizu, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/116,718

(22) Filed: Aug. 29, 2018

(65) Prior Publication Data

US 2019/0279711 A1    Sep. 12, 2019

(30) Foreign Application Priority Data

Mar. 9, 2018  (JP) .................................. 2018-043164

(51) Int. Cl.
*G11C 13/00*  (2006.01)

(52) U.S. Cl.
CPC ........ *G11C 13/0069* (2013.01); *G11C 13/004* (2013.01); *G11C 13/0026* (2013.01); *G11C 13/0028* (2013.01); *G11C 13/0035* (2013.01); *G11C 13/0064* (2013.01); *G11C 2013/0076* (2013.01)

(58) Field of Classification Search
CPC .... G11C 2013/0045; G11C 2013/0076; G11C 2013/0078; G11C 13/0026; G11C 13/0035; G11C 2013/0088
See application file for complete search history.

(56) References Cited

U.S. PATENT DOCUMENTS

| | | | |
|---|---|---|---|
| 9,484,098 B1* | 11/2016 | Hsu ..................... | G11C 11/5642 |
| 10,187,062 B1 | 1/2019 | Shimizu | |
| 2008/0192544 A1* | 8/2008 | Berman .............. | G11C 11/5621 365/185.09 |
| 2009/0161466 A1* | 6/2009 | Hamilton ............... | G11C 16/10 365/222 |
| 2009/0237978 A1* | 9/2009 | Lee .......................... | G11C 8/10 365/148 |
| 2010/0103723 A1* | 4/2010 | Kawai ..................... | G11C 11/56 365/163 |
| 2015/0357035 A1* | 12/2015 | Kim .................... | G11C 13/0033 365/148 |
| 2016/0260472 A1* | 9/2016 | Xu ........................ | G11C 29/50 |
| 2019/0065414 A1 | 2/2019 | Shimizu | |
| 2019/0080757 A1 | 3/2019 | Shimizu | |

* cited by examiner

*Primary Examiner* — Hoai V Ho
*Assistant Examiner* — Jay W. Radke
(74) *Attorney, Agent, or Firm* — Kim & Stewart LLP (57) ABSTRACT

A semiconductor memory device includes nonvolatile memory cells. A first circuit is configured to receive data to be written to the plurality of memory cells, read data from the plurality of memory cells, compare the data to be written to the data that was read, identify each memory cell presently storing a data value that differs from a data value to be written, and identify weak bit data in the existing data. A second circuit is configured to simultaneously program the weak bits and memory cells identified as presently storing the data value that differs from the data value to be written to the memory cell.

20 Claims, 10 Drawing Sheets

|           | RST (1) data | SET (0) data |
|-----------|--------------|--------------|
| SHR       | 1            | 0            |
| ER        | –            | –            |
| DR        | –            | –            |
| SA-RDATA  | –            | –            |
| SAE       | –            | –            |

FIG. 9

|           | RST (1) data | SET (0) data |
|-----------|--------------|--------------|
| SHR       | 1            | 0            |
| ER        | 1            | 1            |
| DR        | 1            | 0            |
| SA-RDATA  | –            | –            |
| SAE       | 1            | 1            |

FIG. 10

|  | RST (1) data | | SET (0) data | |
|---|---|---|---|---|
|  | match | mismatch | match | mismatch |
| SHR | 1 | 1 | 0 | 0 |
| ER | 1 | 0 | 1 | 0 |
| DR | 1 | 1 | 0 | 0 |
| SA-RDATA | 1 | 0 | 0 | 1 |
| SAE | 1 | 0 | 1 | 0 |

FIG. 11

|  | RST (1) data | SET (0) data | |
|---|---|---|---|
|  |  | pass | fail |
| RM0 | Always 1 | pass | fail |
| RM1 | — | — | — |
| SHR | 1 | 0 | 0 |
| ER | 1->1 | 1->0 | 1->1 |
| DR | 1 | 0 | 0 |
| SA-RDATA | 1->1 | 0->0 | 0->1 |
| SAE | 1->1 | 1->0 | 1->1 |

FIG. 12

|  | RST (1) data | | SET (0) data | |
|---|---|---|---|---|
| RM0 | Always 1 | | pass | fail |
| RM1 | pass | fail | Always 0 | |
| SHR | 1 | 1 | 0 | 0 |
| ER | 1->0 | 1->1 | 0->0 | 1->1 |
| DR | 1 | 1 | 0 | 0 |
| SA-RDATA | 1->1 | 1->0 | 0->0 | 1->0 |
| SAE | 1 | 1 | 0 | 1 |

FIG. 13

|  | RST (1) data | | | | SET (0) data | | | |
|---|---|---|---|---|---|---|---|---|
|  | RBW pass | RBW fail | | | RBW pass | RBW fail | | |
| SHR | 1 | | | | 0 | | | |
| ER | 0->0 | 1->1 | 1->1 | 1->1 | 0->0 | 1->1 | 0->1 | 1->1 |
| DR | 1 | | | | 0 | | | |
| SA-RDATA | 1 | | 0 | | 0 | | 1 | |
| SAE | 1 | | | | 1 | | | |

SEMICONDUCTOR MEMORY DEVICE

CROSS-REFERENCE TO RELATED APPLICATIONS

This application is based upon and claims the benefit of priority from Japanese Patent Application No. 2018-043164, filed Mar. 9, 2018, the entire contents of which are incorporated herein by reference.

FIELD

Embodiments described herein relate a semiconductor memory device.

BACKGROUND

Semiconductor memory devices including nonvolatile memory cells are known. For example, data written to a non-volatile memory cell by setting a state of the memory cell is set by an electrical write operation on the memory cell. The state of the memory cell can then be detected by an electrical read operation on the memory cell to read data.

However, the state of the non-volatile memory cell may change over time, unintentionally after the write operation has been performed.

DETAILED DESCRIPTION

In general, according to one embodiment, a semiconductor memory device comprises a plurality of memory cells that are nonvolatile memory cells. A first circuit is configured to receive data to be written to the plurality of memory cells, read data from the plurality of memory cells, compare the data to be written to the data that was read, identify each memory cell presently storing a data value that differs from a data value to be written to the memory cell, and identify each memory cell presently storing a data value that matches the data value to be written but having a threshold voltage closer to a read voltage than a predetermined reference voltage. A second circuit is configured to simultaneously program the memory cells identified as presently storing the data value that differs from the data value to be written to the memory cell and the memory cells identified as presently storing the data value that matches the data value to be written but has the threshold voltage closer to the read voltage than the predetermined reference voltage.

Hereinafter, a semiconductor memory device according to an example embodiment will be described with reference to the accompanying drawings. Furthermore, the present disclosure is not limited to the example embodiment.

Example Embodiment

Figure 1:
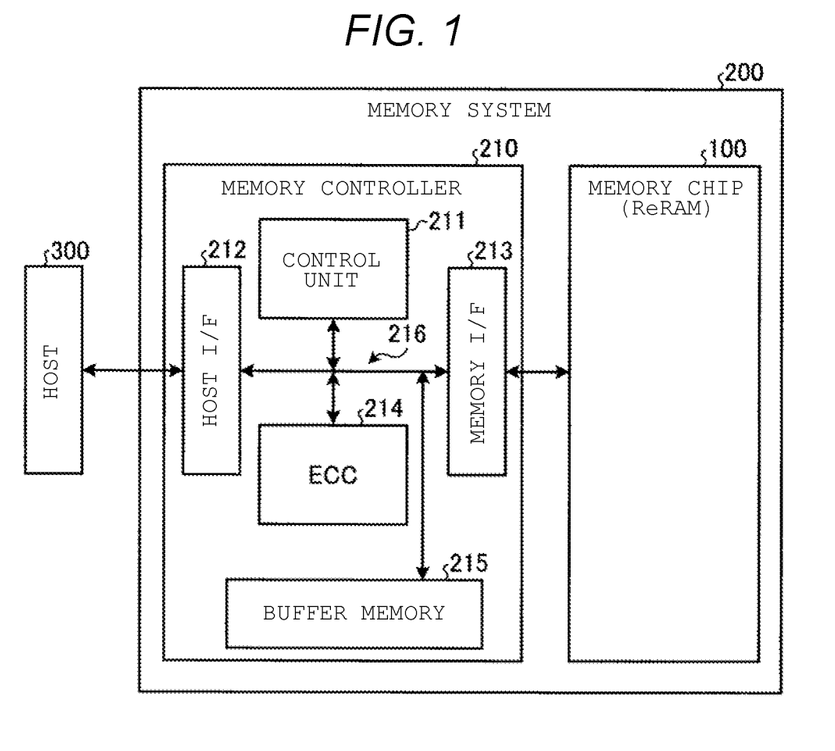
FIG. 1 is a diagram illustrating an example of a memory system which includes a semiconductor memory device of an embodiment.

FIG. 1 is a diagram illustrating an example of a configuration of a memory system which includes the semiconductor memory device of an embodiment. A memory system 200 is communicably connected to a host 300, and serves as an external memory medium with respect to the host 300. The host 300 corresponds to, for example, a server, a personal computer, or a mobile information processing device.

The memory system 200 includes a memory chip 100 and a memory controller 210. The memory controller 210 controls the memory chip 100 autonomously or according to a request or a command from the host 300.

The memory controller 210 includes a control unit 211, a host interface (I/F) 212, a memory interface (I/F) 213, an error correction circuit (ECC) 214, a buffer memory 215, and a bus 216. The control unit 211, the host I/F 212, the memory I/F 213, the ECC 214, and the buffer memory 215 are communicably connected to each other via the bus 216. The control unit 211 is, for example, a central processing operation unit (CPU), and generally controls the respective units in the memory controller 210. The host I/F 212 relays the communication with the host 300. The memory I/F 213 relays data/command with the memory chip 100. The ECC 214 performs an error correction process on the data read from the memory chip 100. The buffer memory 215 buffers data/commands for the memory chip 100, and is used as a work area of the control unit 211.

Figure 2:
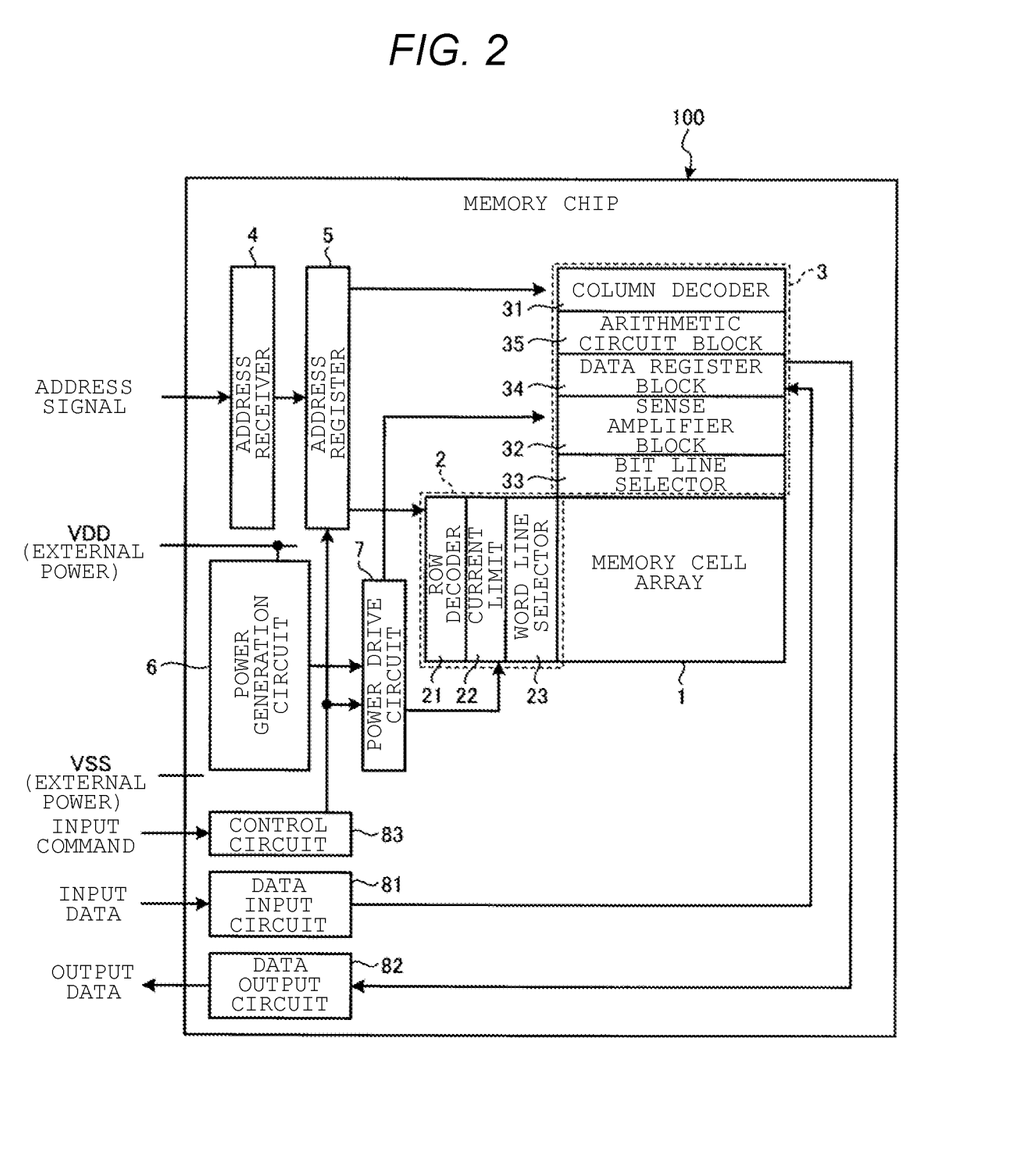
FIG. 2 is a diagram illustrating a configuration of a memory chip.
Figure 3:
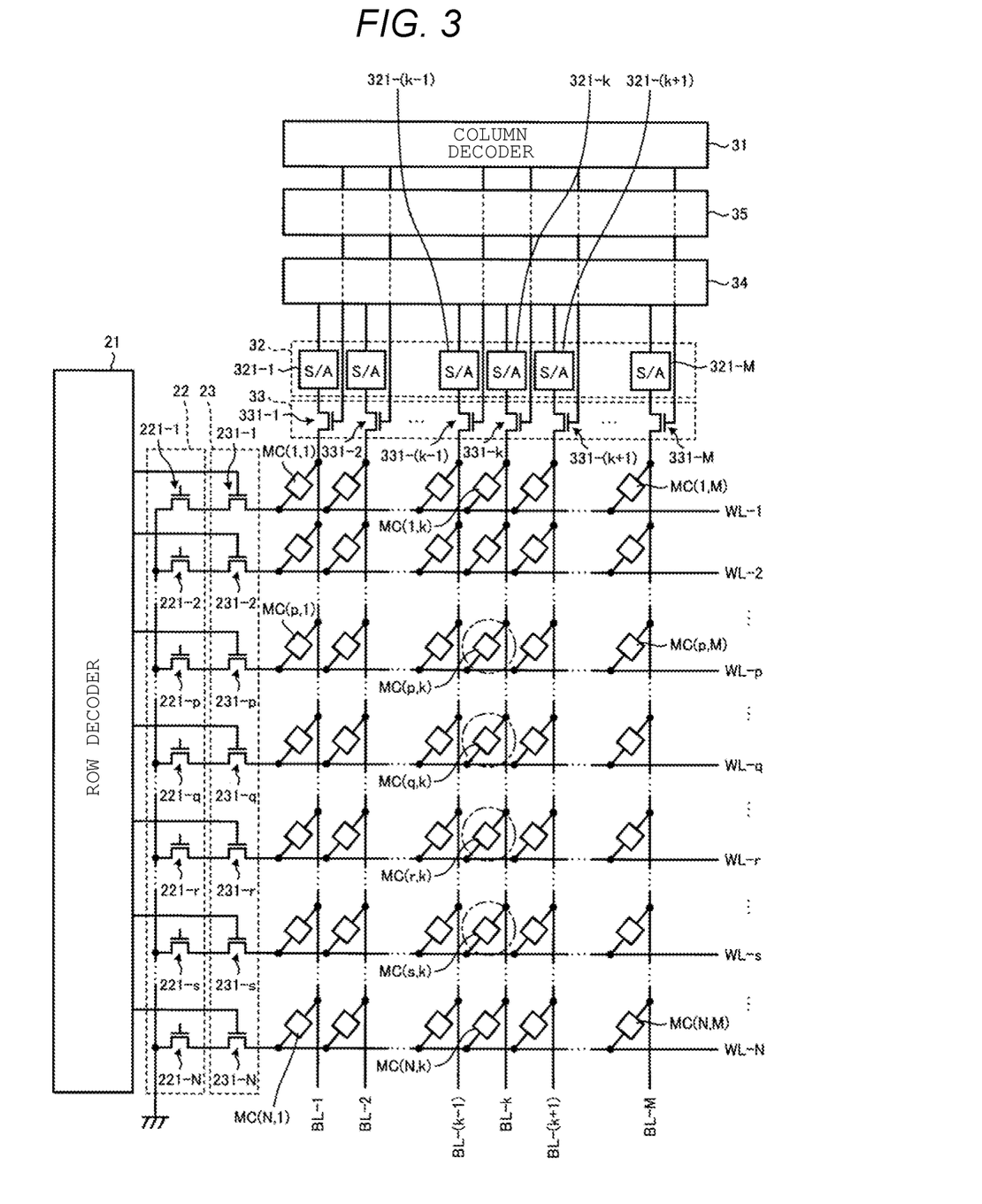
FIG. 3 is a diagram illustrating a configuration of a memory cell array.
Figure 4:
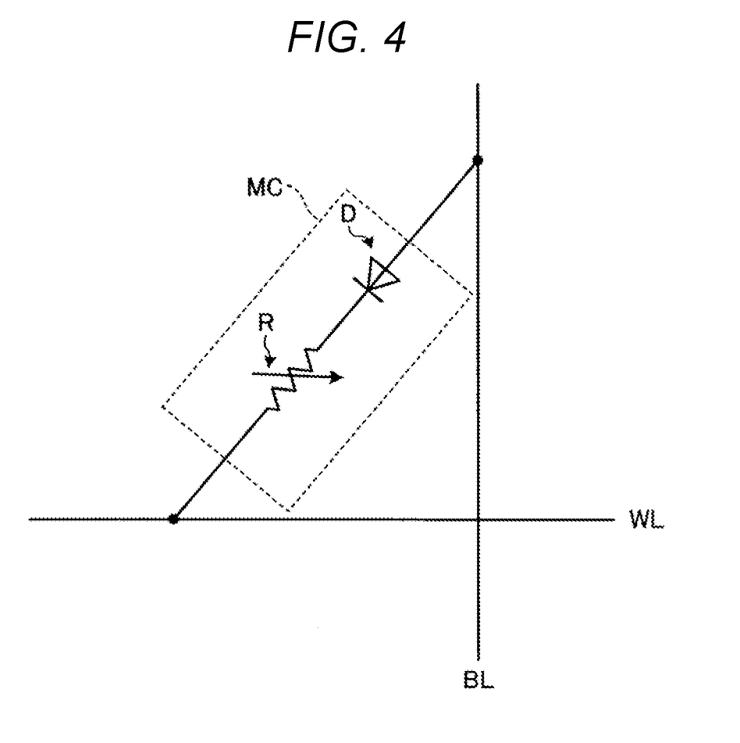
FIG. 4 is a circuit diagram illustrating a configuration of a memory cell.

The memory chip 100 is an example of a semiconductor memory device of an embodiment. FIG. 2 is a diagram illustrating a configuration of the memory chip 100 as the semiconductor memory device of the embodiment. FIG. 3 is a diagram illustrating a configuration of a memory cell array of the embodiment. FIG. 4 is a circuit diagram illustrating a configuration of a memory cell of the embodiment.

The memory chip 100 is, for example, a Resistive Random Access Memory (ReRAM) which includes a variable resistance type memory cell MC. As illustrated in FIG. 2, the memory chip 100 includes a memory cell array 1, a row circuit 2, a column circuit 3, an address receiver 4, an address register 5, a power generation circuit 6, a power drive circuit 7, a control circuit 83, a data input circuit 81, and a data output circuit 82.

In the memory cell array 1, as illustrated in FIG. 3, N word lines WL-1 to WL-N and M bit lines BL-1 to BL-M are provided, and the memory cells MC(1, 1) to MC(N, M) are arranged. In this context, "N" is an integer of four or more, and "M" is an integer of two or more. For example, the memory cells MC(1, 1) to MC(N, M) are two-dimensionally arranged at positions where N word lines WL-1 to WL-N and M bit lines BL-1 to BL-M respectively intersect.

In the memory cell array 1, a three-dimensional array may be provided by stacking a two-dimensional array (also referred to as a memory layer) of memory cells MC.

As illustrated in FIG. 4, in each memory cell MC, a rectifying element D and a variable resistance element R are connected in series. The rectifying element D is, for example, a diode of which the cathode is connected to the variable resistance element R, and the anode is connected to the bit line BL. One end of the variable resistance element R is connected to the word line WL, and the other end of the variable resistance element is connected to the rectifying element D.

The variable resistance element R is an element which switches between a low resistance state and a high resistance state. For example, the variable resistance element R transitions from the high resistance state to the low resistance state when a predetermined set voltage is applied across the memory cell MC to forward bias the rectifying element D (set operation). In addition, the variable resistance element R transitions from the low resistance state to the high resistance state when a predetermined reset voltage is applied across the memory cell MC to forward bias the rectifying element D (reset operation). With this configuration, each memory cell MC is able to store the binary data.

In this specification, an operation including the set operation and/or the reset operation will be called a "write operation". The set operation is an operation of applying the set voltage to the memory cell MC to set a bit value "0". The reset operation is an operation of applying the reset voltage to the memory cell MC to set a bit value "1". An operation of detecting a bit value that has been set in the memory cell MC is called a "read operation".

The write operation (the set operation and the reset operation) includes a "program" operation and "verification" operation. In the write operation, applying a voltage to change a resistance state of the variable resistance element R of a memory cell MC is called a "program" step or operation. The process of verifying whether or not a resistance value has been set to an intended value is called a "verification" step or operation. The "verification" step is actually a kind of the read operation. In this specification, a read operation performed as a part of a write operation after a program step is called a "verification" step or operation. A read operation for purposes other than verification in a write operation is simply called "reading".

In FIG. 4, as an example configuration of each memory cell MC, a direction from the bit line BL to the word line WL is configured as the forward direction of the rectifying element D. However, a direction from the bit line BL to the word line WL may instead be configured as a reverse direction of the rectifying element D. In addition, in each memory cell MC, the layout of the rectifying element D and the variable resistance element R may be exchanged.

The address receiver 4 illustrated in FIG. 2 stores an address signal supplied from the memory controller 210 in the address register 5. The control circuit 83 receives a command supplied from the memory controller 210 and outputs various instructions to the respective circuits based on a sequence determined in advance for the command type. For example, the control circuit 83 outputs an instruction to control an operation voltage and an operation timing in the write operation and the read operation. The address register 5 sends the address signal to the row circuit 2 and the column circuit 3 according to the instruction from the control circuit 83.

The data input circuit 81 sends the write data received along with a write command to a data register block 34 for a write operation.

The data output circuit 82 is connected to the memory controller 210 via an external I/O line and outputs read data and notifies the memory controller 210 that the write operation has been completed.

The power generation circuit 6 generates a power voltage for the write operation and the read operation and supplies the generated power voltage to the power drive circuit 7.

The power drive circuit 7 supplies the power voltage for the write operation and the read operation to the row circuit 2 and the column circuit 3 according to an instruction from the control circuit 83.

The word lines WL-1 to WL-N illustrated in FIG. 3 extend along a row direction and are between adjacent rows of the memory cells MC(1, 1) to MC(N, M).

The row circuit 2 illustrated in FIG. 2 is provided at position adjacent the memory cell array 1 in the word line WL direction (row direction). The row circuit 2 includes a row decoder 21, a current limit block 22, and a word line selector 23. The row decoder 21 receives the address signal from the address register 5, and drives the word line WL via the word line selector 23 according to the address signal. At this time, the current limit block 22 limits the current such that the current value flowing to the selected word line WL will be a predetermined value.

The row decoder 21 includes N decoder circuits (not separately depicted) in correspondence with N word lines WL-1 to WL-N. The current limit block 22 includes N current limit elements 221-1 to 221-N. The word line selector 23 includes N word line drivers 231-1 to 231-N. For example, the decoder circuit selects the word line WL-p via the word line driver 231-$p$, and applies a voltage to the selected memory cell in a p-th row of the memory cells MC(p, 1) to MC(p, M) in order to perform the data write operation or the data read operation. The respective current limit elements 221-1 to 221-N are, for example, NMOS transistors supplied with a gate bias voltage to operate in a linear region and operate as a passive load. With this configuration, an even current can flow to the respective word lines WL when the corresponding memory cell MC is turned on and current flows.

The bit lines BL-1 to BL-M illustrated in FIG. 3 extend in a column direction between the adjacent columns of memory cells MC(1, 1) to MC(N, M).

The column circuit 3 illustrated in FIG. 2 is provided at position adjacent to the memory cell array 1 in an extending direction of the bit line BL. The column circuit 3 is connected to M bit lines BL-1 to BL-M.

For example, the column circuit 3 includes a column decoder 31, the data register block 34, an arithmetic circuit block 35, a sense amplifier block 32, and a bit line selector 33. The column decoder 31 receives the address signal from the address register 5. Then, the column decoder 31 selects the bit line BL via the bit line selector 33 based on the address signal.

The sense amplifier block 32 includes M sense amplifiers (S/A) 321-1 to 321-M in correspondence with M bit lines BL-1 to BL-M. The bit line selector 33 includes M bit line drivers 331-1 to 331-M. For example, the column decoder 31 selects the bit line BL-k via the bit line driver 331-$k$, and performs the data write operation or the data read operation on the selected memory cell in a k-th column of memory cells MC(1, k) to MC(N, k). The sense amplifier 321 electrically sets a state of the memory cell connected to the corresponding bit line BL based on data input from the data register block 34. In addition, each sense amplifier 321 electrically detects the state of the memory cell which is connected to the corresponding bit line BL, and outputs the binary data value corresponding to the detected state to the data register block 34.

Figure 5:
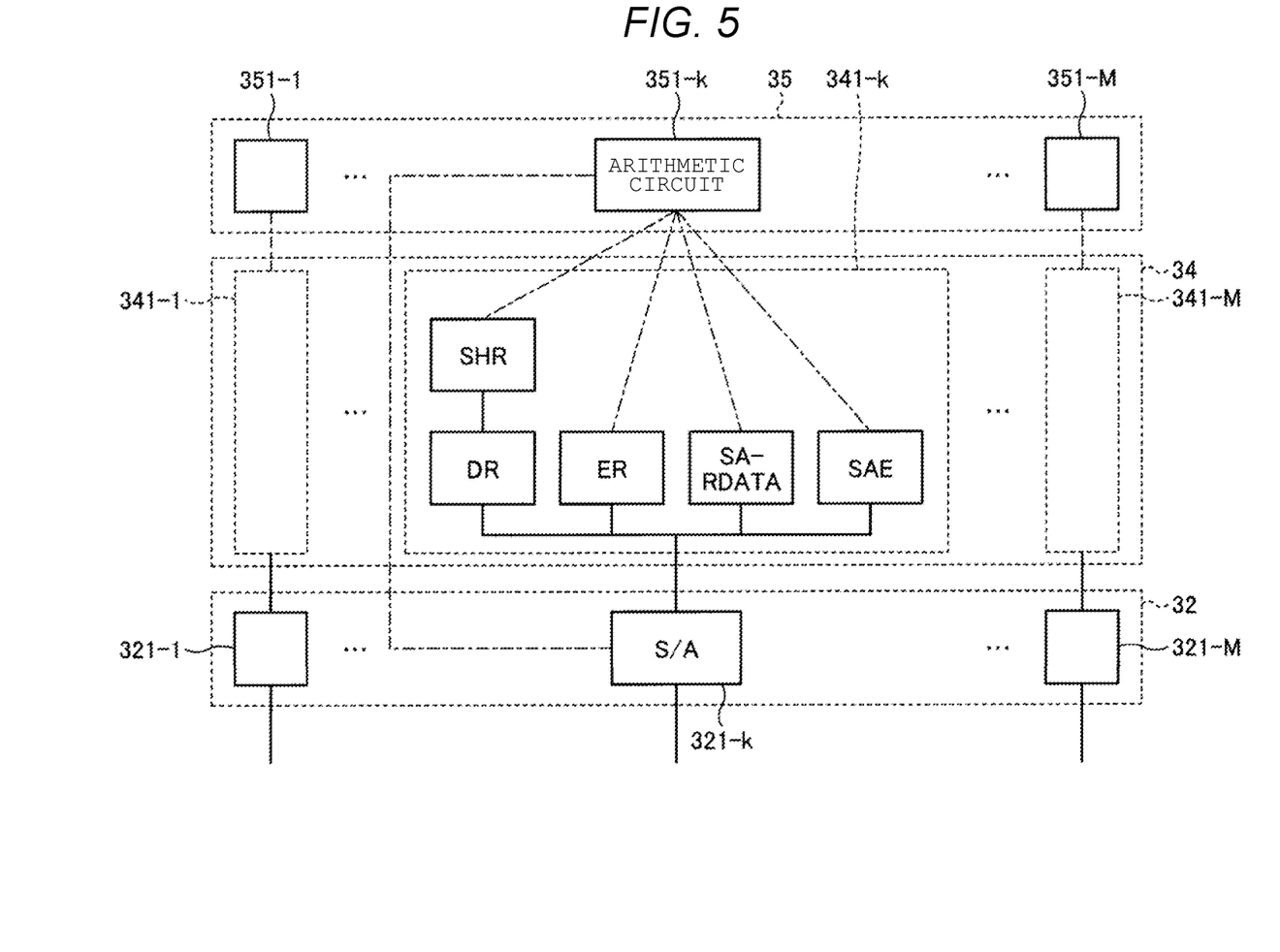
FIG. 5 is a diagram of a register group and an arithmetic circuit.

Further, as illustrated in FIG. 5, the data register block 34 includes M register groups 341-1 to 341-M, and the arithmetic circuit block 35 includes M arithmetic circuits 351-1 to 351-M in correspondence with M bit lines BL-1 to BL-M.

FIG. 5 illustrates a detail register configuration for only the register group 341-$k$ connected to one bit line BL (BL-k) among the register groups 341-1 to 341-M. However, each of the register groups 341-1 to 341-M has the same register configuration as the register group 341-$k$, and thus the description thereof will be omitted.

The register group 341-$k$ includes, for example, a register SHR (also referred to as a shadow register SHR), a register ER (also referred to as a error register ER), a register DR (also referred to as a data register DR), a register SA-RDATA (also referred to as a sense amplifier read data register SA-RDATA), and a register SAE (also referred to as a sense amplifier enable register SAE). The register SHR is connected to the register DR. The register DR, the register ER, the register SA-RDATA, and the register SAE are connected to the corresponding sense amplifier 321-$k$. The arithmetic circuit 351-$k$ performs various types of operations, including data transmission, using these registers in the register group 341-$k$.

The write data input from the data input circuit 81 to the data register block 34 includes pieces of binary data for memory cells connected to the same word line as write destinations. In the register group 341-$k$, the register SHR receives the binary data for the memory cell connected to the bit line BK-k in the write data input from the data input circuit 81 as the destination (write destination).

The binary data is stored in the register SHR and forms the write data which is transferred to the register DR. The binary data is held in the register DR until the end of the write operation to the memory cell at the destination is confirmed. The register SHR can then receive the binary data forming the next write data after the binary data is transferred to the register DR. Hereinafter, the binary data stored in the register DR may be referred to as write target binary data.

The register SA-RDATA receives a value output from the sense amplifier 321-$k$. The register ER stores information indicating whether the value is still a target of the write operation. The register SAE is a register which stores information to instruct operation/nonoperation of the sense amplifier 321-$k$.

In the present embodiment, the memory cell at the write destination is read multiple times during the procedure of the write operation. Plural pieces of binary data obtained by the multiple readings are sequentially stored in the register SA-RDATA. The arithmetic circuit 351-$k$ determines whether the corresponding memory cell is a target of the write operation based on the write target binary data and the plural pieces of binary data sequentially stored in the register SA-RDATA.

Specifically, in a case where the corresponding memory cell stores a value different from the write target binary data, or in a case where the memory cell corresponds to a weak bit, the arithmetic circuit 351-$k$ determines that the memory cell is a target of the write operation. With this regard, in the corresponding memory cell stores the same value as the write target binary data, and the memory cell does not correspond to the weak bit, the arithmetic circuit 351-$k$ determines that the memory cell is not a target of the write operation.

The arithmetic circuit 351-$k$ stores a determination result of whether the memory cell is a target of the write operation in the register ER. The information written in the register ER is transferred to the register SAE. The arithmetic circuit 351-$k$ switches operation/nonoperation of the sense amplifier 321-$k$ based on the information stored in the register SAE.

A "weak bit" memory cell refers to a memory cell having a worse memory state than some predetermined reference value. In the following, the concept of a "weak bit" will be described further.

In a case where the write operation is performed on each memory cell in the memory cell array 1, the binary data as written (to have a written value of "0" or "1") can be detected by performing a read operation. For example, a predetermined voltage is applied across the memory cell in the read operation. With this configuration, a current having a value according to a resistance value of the memory cell (specifically, a current proportional to a reciprocal of the resistance of the memory cell) flows through the memory cell. The binary data written in the memory cell can be detected by detecting this current.

Figure 6:
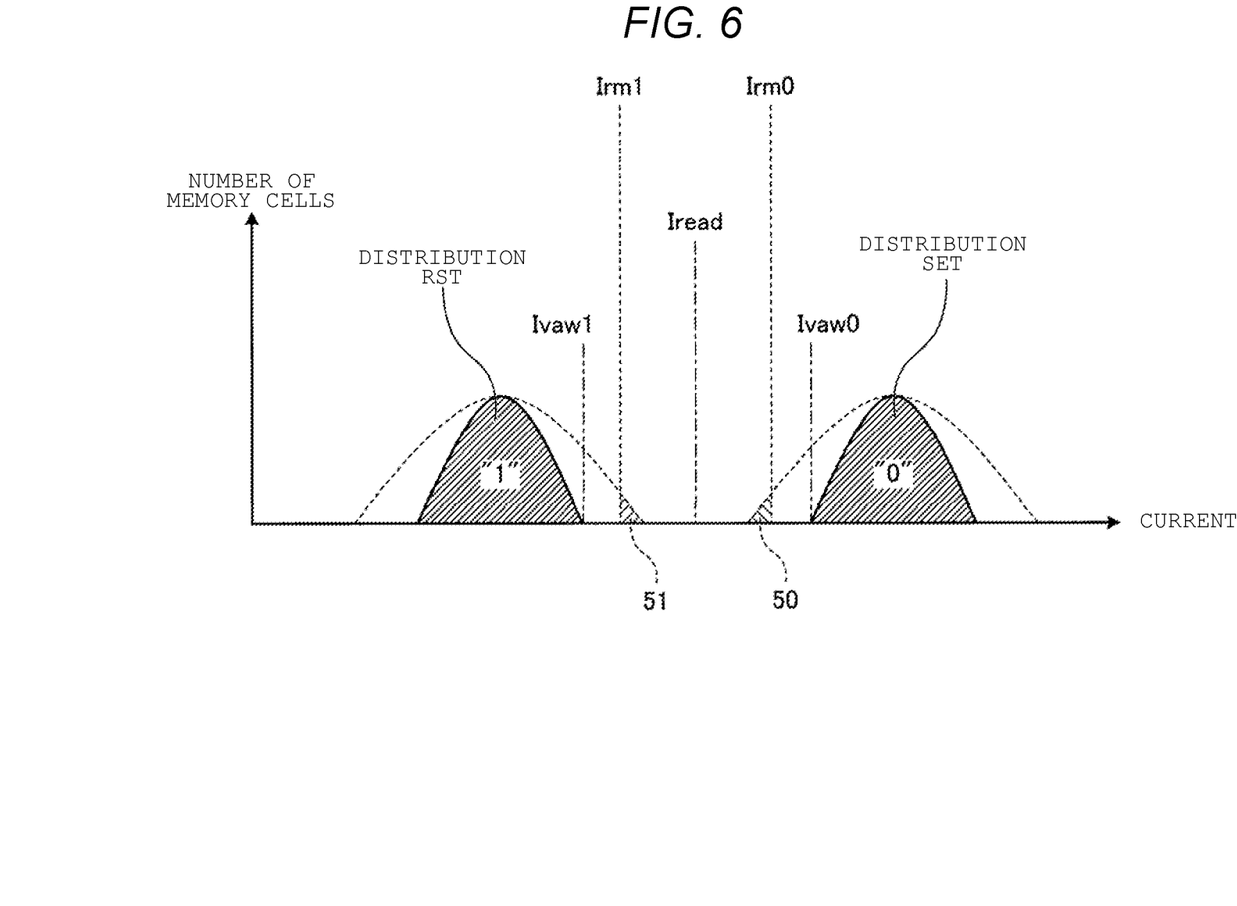
FIG. 6 is a diagram for describing a memory cell which corresponds to a weak bit.

FIG. 6 illustrates a distribution of the memory cells in the memory cell array 1 in which the horizontal axis represents the value of current flowing when a predetermined read voltage Vread is applied to across the memory cells, and the vertical axis represents the number (count) of memory cells at each current value. A hatched region labeled "0" is called the distribution SET and corresponds to those memory cells in a low resistance state (also referred to as a "SET" state). A hatched region labeled "1" is called the distribution RST corresponds to those memory cells in high resistance state (also referred to as a "RESET" state).

The read operation (including "Verification" and "reading") on the memory cell is performed such that the read voltage Vread is applied across the memory cell to check whether the current value (read current value) is lower than a threshold Iread. Here, "Iread" is a threshold corresponding to a boundary between the set state and the reset state.

For example, when the read current value is higher than Iread, the memory cell is read as "0" whether or not the intended or expected data value (the value set by a write operation) was actually "0".

On the other hand, the read voltage Vread applied across the memory cell in the read operation may fluctuate by an influence of wiring resistance and noises. In addition, the apparent set/reset state of a memory cell may be affected by an operating temperature. In consideration of these possibilities, when the set operation is performed as the write operation, the plural memory cells in the memory cell array 1 written to store a "0" data value will have a distribution of read currents as depicted in FIG. 6.

The distribution SET may vary over time from the distribution state depicted with the solid line to the distribution state depicted with the broken line. When the distribution SET changes to the distribution state depicted with the broken line, a memory cell in a region 50 located on a side near the distribution RST with respect to the original distribution SET will still be detected as "0" value since the read current value remains higher than Iread. But with additional time, the memory cell read current value may be further degraded to approach the Iread value (and thus may eventually be mis-read as a "1" value).

However, a memory cell in the region 50 can be detected as a memory cell having a worse memory state than some predetermined reference (that is, the memory cell is in region 50 is a weak bit). The memory cell in the region 50 can be confirmed to have the read current value in a region between Iread and a threshold Irm0 that is provided as a reference point for determining the quality of the memory state.

Here, the threshold current "Irm0" is between Iread and Ivaw0 for example. The current value "Ivaw0" is a threshold value which is used for confirming the sufficiency of the write operation for obtaining a "0" value. The confirmation of the end of the program step is also called "Verification".

A predetermined margin can be provided between Irm0 and Ivaw0. However, in some examples, no margin between Irm0 and Ivaw0 can be provided. In that case, any memory cell for which the read current value is less than Ivaw0 is determined as the weak bit. In other words, the determination of the weak bit becomes stricter as compared to a case where a margin is provided between Irm0 and Ivaw0 current values.

Similarly, in a case where the intended written value "1", and the read current value is lower than Iread, the memory cell is read as "1".

As with the distribution SET, the distribution RST can change from the distribution state depicted with the solid line to the distribution state depicted with the broken line over time. A memory cell in a region 51 located on a side nearer the distribution SET is still read as "1" since its read current value is lower than Iread. However, eventually the read current value may be degraded such that read current value reaches or exceeds Iread and the memory cell can be (mis-) read as a "0" value.

Therefore, the memory cell in the region 51 is detected a weak bit). A threshold Irm1 can be provided as a reference for determining the quality of the memory state for memory cells storing a "1" value.

Here, the value "Irm1" is provided between Iread and Ivaw1 for example. The value "Ivaw1" is a threshold which is used for verifying the end of a programming of a memory cell to a "1" value.

As depicted, a margin is provided between Irm1 and Ivaw1 in FIG. 6. However, in some examples, no margin may be provided between Irm1 and Ivaw1. In that case, any memory cell nominally store a "0" value but having a read current exceeding Ivaw1 is determined as a weak bit. In other words, the determination of the weak bit becomes stricter as compared to a case where margin is provided.

In the this example embodiment, the arithmetic circuit block 35 serves as a first circuit configured to specify the memory cells storing a value different from the write target binary data and the weak bits in the memory cells at the destination of the write data. The control circuit 83, the power drive circuit 7, the row circuit 2, and the column circuit 3 collectively serve as the second circuit configured to perform a program operation with respect to these specified memory cells.

Therefore, the write target binary data is programmed in an overwriting manner for the weak bits, and thus the memory cells transition to an appropriate memory state.

For example, the memory cell in the region 50 transitions to a state in which the read current value will be higher than Ivaw0. The memory cell in the region 51 transitions to a state in which the read current value is lower than Ivaw1.

Thus, any memory cell storing a value different from the write target binary data and any memory cell that is a weak bit (but nominally already storing a value matching the write target binary data) can be collectively programmed. Therefore, it is possible to address the weak bits with more efficiency as compared to a case where the memory cells storing a value different from the write target binary data are programmed at one time in one write operation and the weak bits are programmed at another time in another write operation.

Next, an operation of the memory chip 100 will be described using FIGS. 7 to 13.

Figure 7:
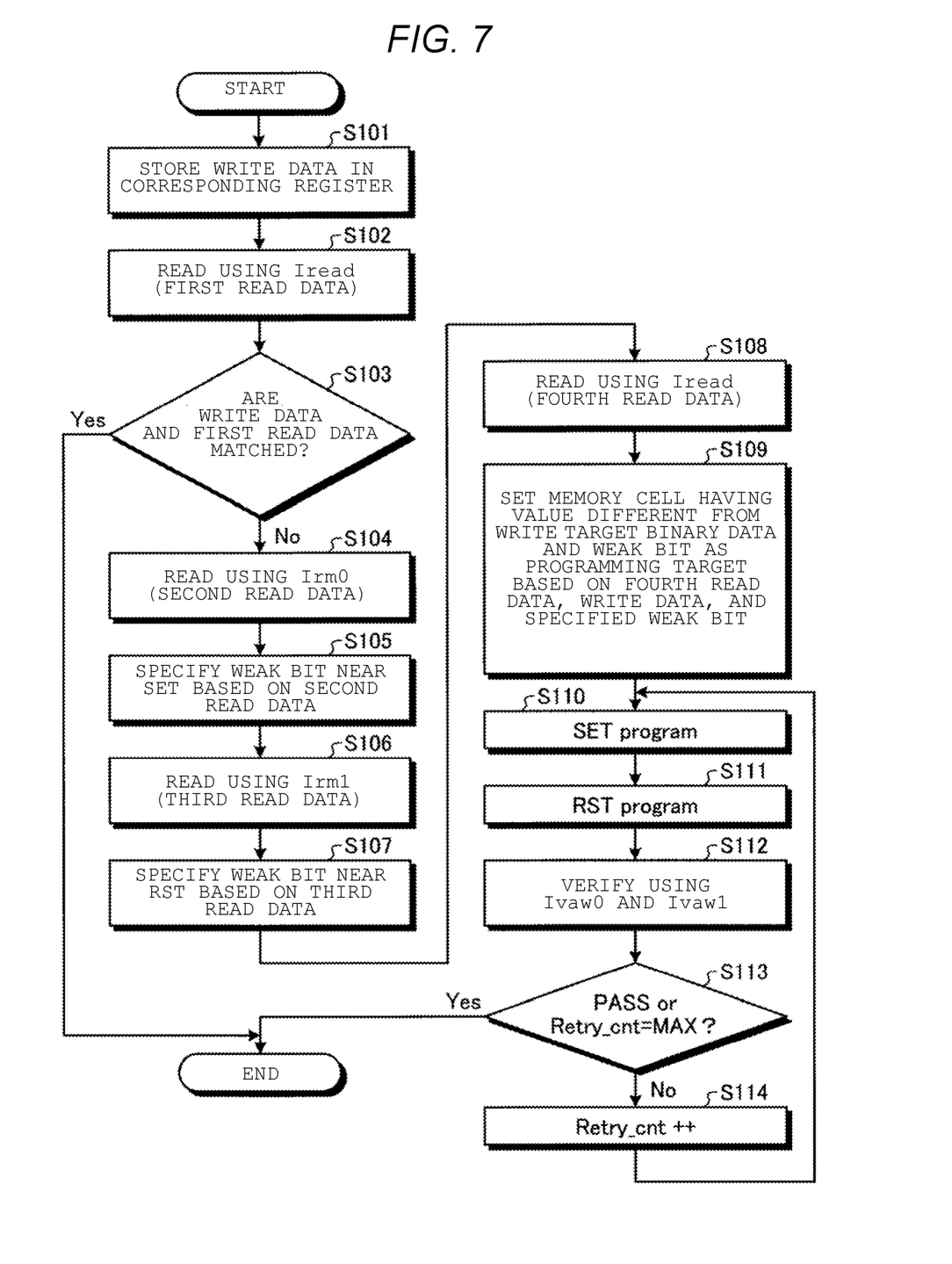
FIG. 7 is a flowchart illustrating an operation of a memory chip.

FIG. 7 is a flowchart illustrating an operation of the memory chip 100 as the semiconductor memory device. FIG. 7 depicts a sequence of an operation initiated by a write command. FIGS. 8 to 13 illustrate the state transitions of the registers in one register group 341 in a case where the write target binary data is "1 (RST)" and "0 (SET)".

The write data input from the memory controller 210 along with the write command is input to the data register block 34. As illustrated in FIG. 7, the write data is stored in the corresponding register (S101).

Figure 8:
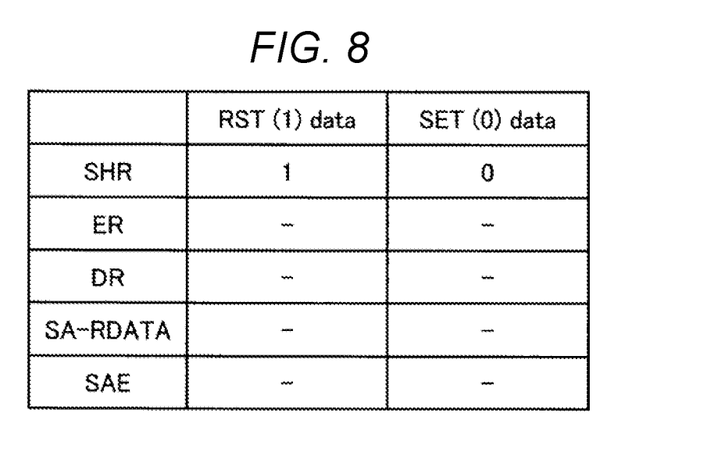
FIG. 8 is a table for describing a state transition of each register of an embodiment.

In S101, a binary data value for each memory cell of a write destination is stored in the register SHR of the register group 341. In other words, the register SHR stores "0" or "1" corresponding to the write target binary data as illustrated in FIG. 8.

Figure 9:
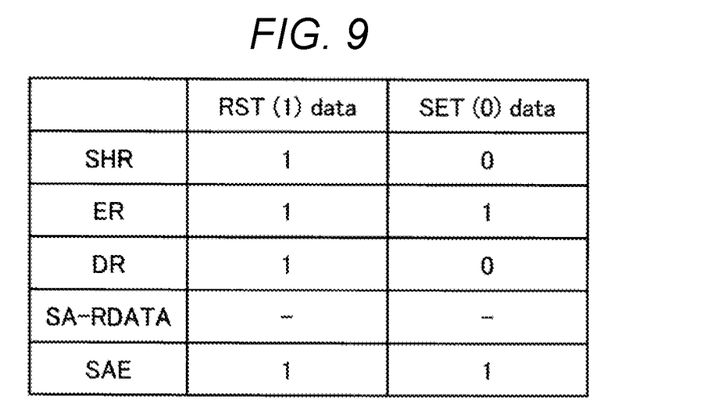
FIG. 9 is a table for describing a state transition of each register of an embodiment.

Further, S101, the arithmetic circuit 351 transfers a content of the register SHR to the register DR, as illustrated in FIG. 9. The arithmetic circuit 351 also stores "1" in the register ER, and copies a content of the register ER to the register SAE.

After S101, the memory cells at the write destination are read using the threshold Iread (S102). The memory cells at the write destination are memory cells which are connected to the bit lines BL selected by the column decoder 31 from among M memory cells connected to the word line WL selected by the row decoder 21.

In S102, the control circuit 83 controls the power drive circuit 7, the row circuit 2, and the column circuit 3 to apply the read voltage Vread to each of the memory cells at the write destination. For individual memory cells, the sense amplifier 321 compares the as-read current value to Iread. In a case where the as-read current value is higher than Iread, a "0" value is stored in the register SA-RDATA of the corresponding register group 341. In a case where the as-read current value is lower than Iread, a "1" value is stored in the register SA-RDATA of the corresponding register group 341.

The binary data stored in the register SA-RDATA in S102 is considered to be the binary data which is currently stored in the memory cells at the write destination. This grouping of the binary data is denoted as first read data.

Subsequently to S102, it is determined whether the write data and the first read data are matching (S103).

The expression "the write data and the first read data are matched" means that the write target binary data and the binary data in the register SA-RDATA in S102 are matched in all the memory cells at the destination. The expression "the write data and the first read data are not matched" means that the write target binary data and the binary data in the register SA-RDATA in S102 are not matched for at least one memory cell in the memory cells at the destination.

In S103, each arithmetic circuit 351 performs the operations of the following Expressions (1) and (2) in this order. Herein, the symbol "=" means to substitute a logical value on the right side for a logical value on the left side. In addition, in this context, "xor" is an operator of exclusive OR and the expression "not(X)" means an inversion of "X".

$$\text{ER} = \text{SA-RDATA xor not(DR)} \quad \text{Expression (1)}$$

$$\text{SAE} = \text{ER} \quad \text{Expression (2)}$$

Figure 10:
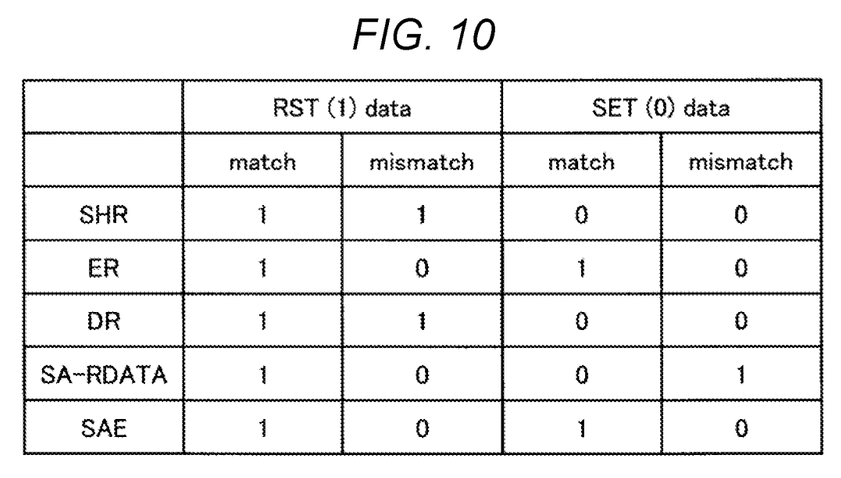
FIG. 10 is a table for describing a state transition of each register of an embodiment.

As a result, as illustrated in FIG. 10, in a case where the write target binary data and the binary data stored in the register SA-RDATA are equal (match), and in a case where "1" is stored in the register SAE, and the write target binary data and the binary data stored in the register SA-RDATA are different (mismatch), "0" is stored in the register SAE.

In a case where "1" is stored in the register SAE with respect to all the memory cells at the destination, the control circuit 83 causes, for example, the memory controller 210 to notify the data output circuit 82 of completion of executing the write command. In a case where "0" is stored in the register SAE for any one of the memory cells at the destination, the process of S104 can be performed.

In S104, the memory cells at the write destination are read (read operation) using the threshold Irm0 (S104). A set of the binary data detected in S104 is denoted as second read data. Subsequently to S104, the weak bit on a side near the distribution SET is specified based on the second read data (that is, the memory cell in the region 50) (S105).

In S104, for example, the control circuit 83 controls the power drive circuit 7, the row circuit 2, and the column circuit 3 to apply the read voltage Vread to the memory cells at the write destination. The sense amplifier 321 compares the as-read current value to Irm0. In a case where the as-read current value is higher than Irm0, "0" is stored in the register SA-RDATA of the corresponding register group 341. In a case where the as-read current value is lower than Irm0, "1" is stored in the register SA-RDATA of the corresponding register group 341.

The arithmetic circuit 351 sets the corresponding sense amplifier 321 to enabled in a case where the register SAE is "1", and sets the corresponding sense amplifier 321 to disabled in a case where the register SAE is "0". In other words, in S105, the reading (read operation) is performed only on those memory cells already storing the same value as the write target binary data.

The method of setting a reading target of S104 is not limited to the above configuration. In some examples, all the memory cells at the write destination may be set as the reading target rather than only those already matching the write target binary data.

In S105, the arithmetic circuit 351 performs the operations of the following Expressions (3) and (4) in this order. In this context, "and" represents an operator of logical product.

$$\text{ER} = \text{SAE and SA-RDATA} \quad \text{Expression (3)}$$

$$\text{SAE} = \text{ER} \quad \text{Expression (4)}$$

Figure 11:
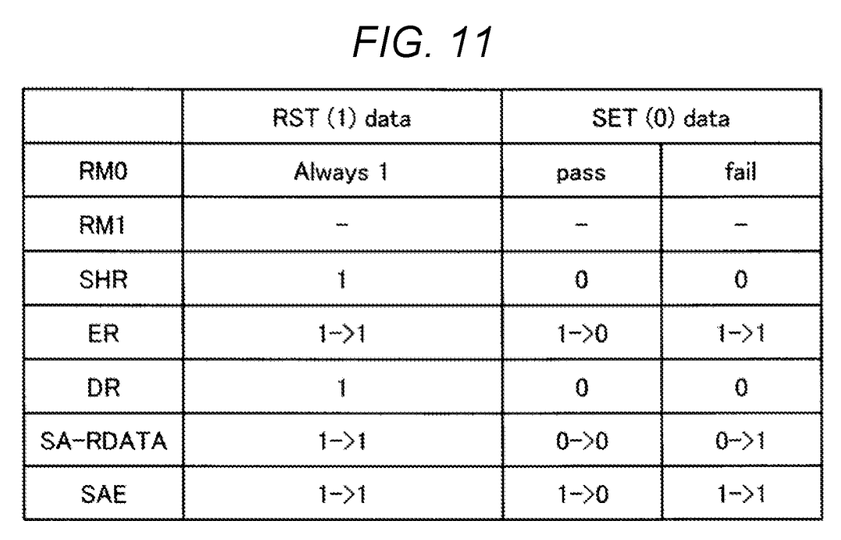
FIG. 11 is a table for describing a state transition of each register of an embodiment.

As a result of the processes of S104 and S105, the content of each register is changed as illustrated in FIG. 11. In FIG. 11 (and subsequent drawings), the expression X→Y indicates that the content in the register is changed from value "X" to value "Y", whatever those "X" and "Y" might be in the figure (s). For example, in a case where the write target binary data is "0", and the content of the register SA-RDATA is not changed but remains at "0" in the process of S104 with respect to the memory cell storing "0" (Irm0: pass), the content of the register ER is changed from "1" to "0" by the process of S105. This change corresponds to the determination that the corresponding memory cell is not a weak bit.

In a case where the write target binary data is "0", and the content of the register SA-RDATA is changed from "0" to "1" in the process of S104 with respect to the memory cell storing "0" (Irm0: fail), that is, in a case where the corresponding memory cell is in the region 50, the content of the register ER is not changed but remains at "1" in the process of S105. The configuration that the content of the register ER remains at "1" in the process of S105 corresponds to the configuration that the corresponding memory cell is specified as the weak bit.

In a case where the write target binary data is "1" and the memory cell already stores "1", there is no possibility to detect "0" in the reading of S104. The reason for this is because, since the memory cell having a read current lower than Iread is specified as the memory cell storing "1", the content will of course be detected as "1" when the memory cell uses the threshold Irm0 higher than Iread. Therefore, when the write target binary data is "1" and the memory cell already stores "1", a case where "0" is detected is not illustrated (Irm0: Always 1).

Subsequently to S105, the memory cell group at the destination is read using the threshold Irm1 (S106). A set of the binary data detected in S106 is denoted as third read data. Subsequently to S106, the weak bits (that is, the memory cells in the region 51) on a side near the distribution RST are specified based on the third read data (S107).

For example, in S106, the control circuit 83 controls the power drive circuit 7, the row circuit 2, and the column circuit 3 to apply the read voltage Vread to the memory cell at the destination for the write data. The sense amplifier 321 compares the as-read current value to Irm1. In a case where the as-read current value is higher than Irm1, a "0" value is stored in the register SA-RDATA of the corresponding register group 341. In a case where the as-read current value is lower than Irm1, a "1" value is stored in the register SA-RDATA of the corresponding register group 341.

In S106, similarly to the case of S104, the arithmetic circuit 351 sets the corresponding sense amplifier 321 to enabled in a case where the register SAE is "1", and sets the corresponding sense amplifier 321 to disabled in a case where the register SAE is "0". In other words, in S106, only those memory cells, other than the memory cells which are not weak bits on a side near the distribution SET in the process of S105, are read from the memory cells storing the same value as the write target binary data for the memory cells at the destination.

Further, the method of setting the reading target of S106 is not limited. All the memory cells at the destination may be set as the reading target.

In S107, the arithmetic circuit 351 performs the operation of the following Expression (5).

$$\text{ER} = \text{SAE and not(SA-RDATA)} \quad \text{Expression (5)}$$

Figure 12:
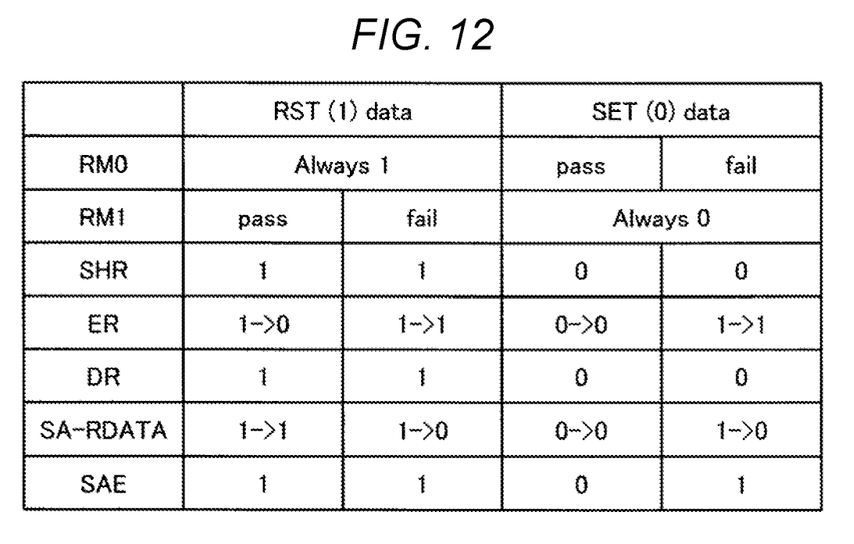
FIG. 12 is a table for describing a state transition of each register in the embodiment.

As a result of the processes of S106 and S107, as illustrated in FIG. 12, when the write target binary data is "1" and the memory cell stores "1", the content of the register ER is changed from "1" to "0" by the process of S107 in a case where the content of the register SA-RDATA remains at "1" in the process of S106 (Irm1: pass). This change corresponds to the determination that the corresponding memory cell is not a weak bit.

When the write target binary data is "1" and the content of the register SA-RDATA is changed from "1" to "0" in the process of S106 for the memory cell storing "1" (Irm1: fail), that is, the corresponding memory cell is in the region 51, the content of the register ER is not changed but remains at "1". When the content of the register ER remains at "1" in the process of S107 then the corresponding memory cell is specified as a weak bit.

When the write target binary data is "0" and the memory cell stores "0", there is substantially no possibility to detect "1" in the reading of S106 because the as-read current value was already higher than Iread, the content was detected as "0" so of course a lower threshold Irm1 value is used rather than Iread the memory cell will still be detected as storing "0". Therefore, when the write target binary data is "0" and the memory cell stores "0", a case where "1" is detected is not illustrated (Irm1: Always 0).

In the processes of S104 to S107, the register ER comes to be the state of "1" in a case where the corresponding memory cell is specified as a weak bit. The register ER comes to be the state of "0" in a case where it is determined that the corresponding memory cell is not a weak bit.

Subsequently to S107, the memory cell group at the destination is read using the threshold Iread (S108). The reading in S108 is denoted as a Read Before Write (RBW). A set of the binary data detected in S108 is denoted fourth read data.

In S108, all the memory cells at the write destination are set as a read target. In other words, the arithmetic circuit 351 stores "1" in the register SAE.

Then, similarly to the case of S102, the control circuit 83 controls the power drive circuit 7, the row circuit 2, and the column circuit 3 to apply the read voltage Vread to the memory cells of the write destination. Each of the sense amplifiers 321 compares the as-read current value to Iread. In a case where the read current value is higher than Iread, "0" is stored in the register SA-RDATA of the corresponding register group 341. In a case where the read current value is lower than Iread, "1" is stored in the register SA-RDATA of the corresponding register group 341.

The fourth read data detected in S108 contains the same content as the first read data. However, the first read data is already held in a predetermined register, and the process of S108 may be omitted in some instances.

Subsequently to S108, the memory cells storing a value different from the write target binary data and the memory cells which are weak bits are set as a program target based on the fourth read data, the write data, and the specified weak bits (S109). In other words, the memory cells storing a value different from the write target binary data and also those that are weak bits are specified to be programmed (or re-programmed).

In S109, for example, the arithmetic circuit 351 sequentially performs the operations of the following Expressions (6) and (7) in this order. In this context, "or" is an operator of logical sum.

$$\text{ER}=(\text{SA-RDATA xor DR}) \text{ or ER} \qquad \text{Expression (6)}$$

$$\text{SAE}=\text{ER} \qquad \text{Expression (7)}$$

Figure 13:
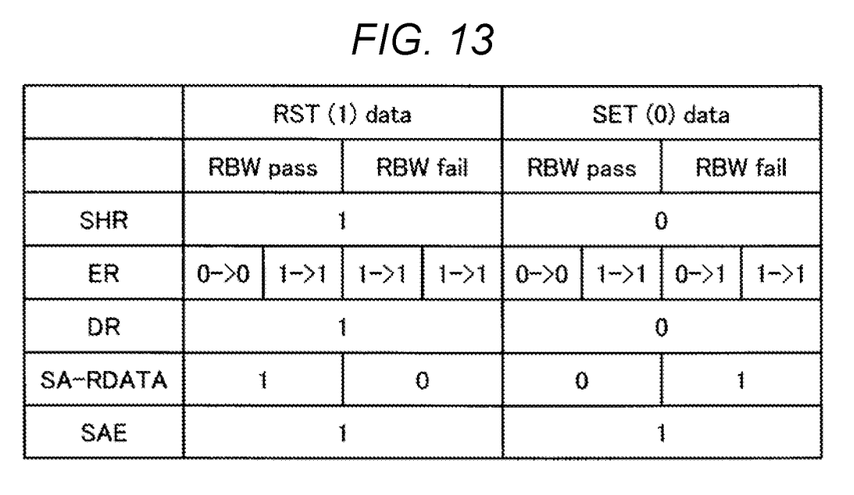
FIG. 13 is a table for describing a state transition of each register of an embodiment.

As illustrated in FIG. 13, in a case where the write target binary data and the binary data of the fourth read data are different in value (RBW fail) as a result of the operation of Expression (6), a value "1" is stored in the register ER.

When the write target binary data and the binary data of the fourth read data are equal in value (RBW pass), and the memory cell is a weak bit, a value "1" is stored in the register ER, and a value "0" is stored in a case where the memory cell is not a weak bit.

In other words, those memory cells storing a value different from the write target binary data and those memory cells already storing the intended value in the write target binary data but having been identified as weak bits, have a value "1" (meaning the corresponding memory cell is a program target) stored in the register ER of the corresponding register group 341. Those memory cells which are not weak bits but already store the same value as the write target binary data, have a value "0" (meaning the corresponding memory cell is not a program target) stored in the register ER of the corresponding register group 341.

The content of the register ER is transferred to the register SAE by the operation of Expression (7). Then, the writing (SET program) for the binary data of "0" and the writing (RST program) for the binary data of "1" are performed (S110, S111).

Specifically, in S110, the control circuit 83 controls the power drive circuit 7, the row circuit 2, and the column circuit 3 to apply the set voltage to across the memory cells having "0" as the write target binary data for those the memory cells having "1" stored in the register SAE of the corresponding register group 341.

With this configuration, a value "0" is programmed into those memory cell which previously stored "1" and those memory cells which already store "0" but are identified as weak bits from among the memory cells already storing "0" value Similarly, in S111, the control circuit 83 applies the reset voltage across those memory cells having "1" as the write target binary data for those memory cells storing "1" in the corresponding register SAE.

With this configuration, a value "1" is programmed into those memory cells which previously stored "0" and those memory cells which already store "1" but are identified as weak bits.

Subsequently to S111, a "Verification" is performed using Ivaw0 and Ivaw1 for confirming the sufficiency of the programming operation (S112). Then, it is determined whether the result of "Verification" is OK (PASS) or whether a retry counter Retry_cnt has reached a threshold of retry counter MAX (S113).

In S112, for example, the control circuit 83 controls the power drive circuit 7, the row circuit 2, and the column circuit 3 to apply the read voltage Vread across memory cells of the write destination.

Then, if the write target binary data is "0", the sense amplifier 321 compares the read current value with Ivaw0. If the read current value is higher than Ivaw0, "0" is stored in the register SA-RDATA of the corresponding register group 341. In a case where the read current value is lower than Ivaw0, "1" is stored in the register SA-RDATA of the corresponding register group 341.

On the other hand, if the write target binary data is "1", the sense amplifier 321 compares the read current value with Ivaw1. If the read current value is higher than Ivaw1, "0" is stored in the register SA-RDATA of the corresponding register group 341. If the read current value is lower than Ivaw1, "1" is stored in the register SA-RDATA of the corresponding register group 341.

The arithmetic circuit 351 performs the operations of Expressions (8) and (9) in this order.

$$\text{ER}=\text{SA-RDATA xor DR} \qquad \text{Expression (8)}$$

$$\text{SAE}=\text{ER} \qquad \text{Expression (9)}$$

If the as-read current value is higher than Ivaw0, "0" is stored in the register ER and the register SAE. If the as-read current value is lower than Ivaw0, "1" is stored in the register ER and the register SAE.

If the as-read current value is lower than Ivaw1, "0" is stored in the register ER and the register SAE. If the as-read current value is higher than Ivaw1, "1" is stored in the register ER and the register SAE.

In S113, the control circuit 83 determines that the result of "Verification" is OK (PASS) in a case where "0" is stored in all registers ER of the register group 341 related to the memory cells at the destination. In a case where "1" is stored in any of the registers ER of the register group 341 for the memory cells at the write destination, it is determined that the result of "Verification" is NG (no good).

In a case where it is determined that the result of "Verification" is OK (S113, Yes), the sequence of the operations related to the write command ends.

In a case where it is determined that the result of "Verification" is NG and the retry counter Retry_cnt has not yet reached the threshold of the retry counter MAX (S113, No), the retry counter Retry_cnt is increased (incremented by 1) (S114), and the process of S110 is performed again.

The retry counter Retry_cnt is provided in the control circuit 83, for example, and is increased by the control circuit 83. The retry counter Retry_cnt is reset to zero by the control circuit 83 when the sequence of the operation according to the write command begins. The implementation of the retry counter Retry_cnt and the incrementing of the retry counter Retry_cnt are not limited to the above configuration.

In the process of S103, in a case where the write data and the first read data are matched (S103, Yes), the sequence of the operation according to the write command ends.

In this way, the memory cells storing a value different from the write target binary data and the weak bits from all the memory cells at the write destination are simultaneously programmed in a group. Each of the memory cells is repeatedly programmed by a predetermined number of times (the threshold MAX) as an upper limit until the result of "Verification" is OK. Therefore, in a case where the verification results in OK before the number of times of a program reaches the threshold MAX, the memory cells at the write destination will not be weak bits.

The configuration of the arithmetic circuit 351 and the register group 341 illustrated in FIG. 5, and an operation method of the arithmetic circuit 351 described using Expressions (1) to (9) are merely examples. The operation method of the arithmetic circuit 351, the register group 341, and the configuration of the arithmetic circuit 351 may be changed in various ways so long as the arithmetic circuit block 35 can operate to specify the memory cells storing a value different from the write target binary data and the weak bits based on the first to fourth read data detected using Iread, Irm0, and Irm1 and can set specified memory cells as a program target.

In addition, the above-description has been given assuming the arithmetic circuit block 35 serves as the first circuit and the control circuit 83, the power drive circuit 7, the row circuit 2, and the column circuit 3 serve as the second circuit. However, the particular circuits handling the functions of the first circuit and the second circuit are not limited to the above configuration.

As described above, when the memory chip 100 receives the write data, the arithmetic circuit block 35 specifies the memory cells storing a value different from the write target binary data and the weak bits using the arithmetic circuit 351 (S103 to S109). Then, the control circuit 83, the power drive circuit 7, the row circuit 2, and the column circuit 3 collectively program the write target binary data to the memory cells storing a value different from the write target binary data and also the weak bits already storing data matching the write target binary data (S110 to S114).

In some instances, the programming of the memory cells storing values different from the write target binary data and reprogramming of the weak bit may be performed at different timing. In that case, two separate loop processes are needed (corresponding to a loop process of S110 to S114).

However, in the present embodiment, the writing of data and the reprogramming of weak bits already holding the intended data occur in one loop process (the loop process of S110 to S114). Therefore, a total processing time can be shortened as compared to a case where the program to the memory cells storing a value different from the write target binary data and the re-program of the weak bits are performed at different times. Therefore, the weak bits can be refreshed (made appropriate) with improved efficiency and an operational convenience of the memory chip 100 is improved.

In addition, according to the present embodiment, the arithmetic circuit block 35 specifies the memory cells which does are not weak bits among the memory cells already storing the same value as the write target binary data by the arithmetic circuit 351 (S103 to S109). Then, the control circuit 83, the power drive circuit 7, the row circuit 2, and the column circuit 3 exclude these memory cells (which do not correspond to the weak bits and already store the intended data value) from a program target (S110 to S114).

The repeated programming on memory cells is one of factors which causes degradation of the memory cells. Since those memory cells which do not correspond to the weak bits and already store the intended binary data value are not unnecessarily programmed, it is possible to prevent the degradation in the memory cell due to unneeded programming steps.

Further, the memory cell in this example is a variable resistance memory cell. The sense amplifier block 32 detects the read current value, which varies according to a resistance value of the memory cell, by using the sense amplifier 321. The arithmetic circuit block 35 specifies the weak bits as those memory cells having an as-read current value between Iread and Irm0 using the arithmetic circuit 351 for the memory cells having "0" as the write target binary data. In addition, the arithmetic circuit block 35 specifies those memory cells having an as-read current value between Iread and Irm1 using the arithmetic circuit 351 for memory cells having "1" as the write target binary data. In this context, "Irm0" is a threshold set between Iread and Ivaw0, and "Irm1" is a threshold set between Iread and Ivaw1.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the present disclosure. The accompanying claims and their equivalents are intended to cover such embodiments or modifications as would fall within the scope and spirit of the present disclosure.

What is claimed is:

1. A semiconductor memory device, comprising:
   a plurality of memory cells that are nonvolatile memory cells;
   a first circuit configured to receive data to be written to the plurality of memory cells, read data from the plurality of memory cells, compare the data to be written to the data that was read, identify each memory cell presently storing a data value that differs from a data value to be written to the memory cell, and identify each memory cell presently storing a data value that matches the data value to be written but having a threshold voltage closer to a read voltage than a predetermined reference voltage; and
a second circuit configured to simultaneously program the memory cells identified as presently storing the data value that differs from the data value to be written to the memory cell and the memory cells identified as presently storing the data value that matches the data value to be written but has the threshold voltage closer to the read voltage than the predetermined reference voltage.

2. The semiconductor memory device according to claim 1, wherein
the first circuit is further configured to identify each memory cell presently storing a data value that matches a data value to be written to the memory cell that has a threshold voltage that is not closer to the read voltage than the predetermined reference voltage, and
the second circuit is further configured not to program the memory cells presently storing the data value that matches the data value to be written and having the threshold voltage that is not closer to the read voltage than the predetermined reference voltage.

3. The semiconductor memory device according to claim 1, wherein the memory cells are variable resistance memory cells.

4. The semiconductor memory device according to claim 3, further comprising:
a third circuit configured to detect a current value according to a resistance value of each memory cell.

5. The semiconductor memory device according to claim 1, wherein the memory cells are resistive random access memory cells.

6. The semiconductor memory device according to claim 1, further comprising:
a register block including a plurality of data registers in which the first circuit transfers data values corresponding to data to be written to the plurality of memory cells.

7. The semiconductor memory device according to claim 6, wherein the plurality of data registers are divided into register groups corresponding to each column of memory cells in the plurality of memory cells.

8. A non-volatile memory chip, comprising:
a memory cell array comprising a plurality of non-volatile memory cells, each connected between a word line and a bit line;
an address register for storing an address range of data to be written to the memory cell array;
a sense amplifier block including a sense amplifier for each bit line;
a bit line selector block between the sense amplifier block and each bit line;
a column decoder configured to selectively connect each bit line to the sense amplifier block;
a register block including a plurality of registers connected to each sense amplifier and configured to store first data to be written to the address range;
an arithmetic circuit block connected between the column decoder and the sense amplifier block and configured to perform logical operations on data values stored in the plurality of registers;
a row decoder configured to selectively supply voltages to each word line; and
a controller configured to control the row decoder, the column decoder, the sense amplifier block, and the bit line selector block to:

read second data from the memory cell array at the address range using a first read current before writing of the first data to the memory cell array and store the second read data in a register;
using the arithmetic circuit block, compare the first data and the second data to determine whether data values in the first data match data values in the second data;
read third data from the memory cell array at a first portion of the address range using a second read current greater than the first read current and, by using the arithmetic circuit block, specify weak bits by comparison of the data values in the second data and data values in the third data;
read fourth data from the memory cell array at a second portion of the address range using a third read current less than the first read current and, by using the arithmetic circuit block, specify weak bits by comparison of data values in the second data and data values in the fourth data;
establish fifth data in a register using the arithmetic circuit block, the fifth data including all mismatches between the first and second data and all specified weak bits; and
write the fifth data to the memory cell array at the address range.

9. The non-volatile memory chip according to claim 8, wherein the memory cell array comprises memory cells that are resistive random access memory cells.

10. The non-volatile memory chip according to claim 8, wherein the memory cell array comprises variable resistance memory cells.

11. The non-volatile memory chip according to claim 8, wherein the data register block includes a register group for each bit line.

12. The non-volatile memory chip according to claim 11, wherein each register group consists of five separate registers.

13. The non-volatile memory chip according to claim 8, wherein establishing the fifth data includes reading data values from the address range of the memory cell array at the first threshold current after specifying the weak bits.

14. The non-volatile memory chip according to claim 8, wherein writing the fifth data to the memory cell array includes a verification process for confirming the fifth data has been successfully written.

15. A method of controlling a non-volatile memory device, comprising:
receiving first data, the first data being data to be written to a memory cell array at an address range in the memory cell array according to an external command;
reading second data from the memory cell array at the address range using a first read current before writing of the first data to the memory cell array;
comparing the first data and the second data to determine whether data values in the first data match data values in the second data;
reading third data from the memory cell array at a first portion of the address range using a second read current greater than the first read current and specifying weak bits by comparison of the data values in the second data and data values in the third data;
reading fourth data from the memory cell array at a second portion of the address range using a third read current less than the first read current and specifying weak bits by comparison of data values in the second data and data values in the fourth data;
establishing fifth data including all mismatches in the first and second data and all specified weak bits; and writing the fifth data to the memory cell array at the address range.

16. The method according to claim 15, wherein the memory cell array comprises memory cells that are resistive random access memory cells.

17. The method according to claim 15, wherein the memory cell array comprises variable resistance memory cells.

18. The method according to claim 15, wherein the writing of the fifth data includes a verification process for confirming the fifth data has been successfully written.

19. The method according to claim 15, wherein the memory cells store binary values and the writing of the fifth data includes a set program process and a reset program process.

20. The method according to claim 19, wherein
the weak bits specified by comparison of the data values in the second data and data values in the third data are reprogrammed in the set program process, and the weak bits specified by comparison of the data values in the second data and data values in the fourth data are reprogrammed in the reset program process.

* * * * *